(12) United States Patent
Yen et al.

(10) Patent No.: US 12,300,565 B2
(45) Date of Patent: May 13, 2025

(54) CHIP PACKAGE UNIT AND CHIP PACKAGING METHOD

(71) Applicant: Richtek Technology Corporation, Zhubei (TW)

(72) Inventors: Hao-Lin Yen, Taoyuan (TW); Heng-Chi Huang, Hsinchu (TW); Yong-Zhong Hu, Cupertino, CA (US)

(73) Assignee: RICHTEK TECHNOLOGY CORPORATION, Zhubei (TW)

( * ) Notice: Subject to any disclaimer, the term of this patent is extended or adjusted under 35 U.S.C. 154(b) by 530 days.

(21) Appl. No.: 17/718,125

(22) Filed: Apr. 11, 2022

(65) Prior Publication Data

US 2022/0367309 A1 Nov. 17, 2022

(30) Foreign Application Priority Data

May 11, 2021 (TW) ................. 110116946

(51) Int. Cl.
*H01L 23/34* (2006.01)
*H01L 21/56* (2006.01)
*H01L 23/31* (2006.01)

(52) U.S. Cl.
CPC ............ *H01L 23/34* (2013.01); *H01L 21/561* (2013.01); *H01L 23/3107* (2013.01)

(58) Field of Classification Search
CPC ................... H01L 23/34; H01L 23/36–3738
See application file for complete search history.

(56) References Cited

U.S. PATENT DOCUMENTS

| | | | |
|---|---|---|---|
| 6,023,096 A | 2/2000 | Hotta et al. | |
| 6,411,507 B1 | 6/2002 | Akram | |
| 8,794,889 B2 | 8/2014 | Aukzemas et al. | |
| 2008/0068803 A1* | 3/2008 | Chen | H01L 23/467 361/708 |
| 2019/0006200 A1 | 1/2019 | Lin et al. | |
| 2019/0320536 A1* | 10/2019 | Gera | H05K 1/0296 |
| 2021/0111120 A1 | 4/2021 | Chen et al. | |

* cited by examiner

*Primary Examiner* — Daniel P Shook

(74) *Attorney, Agent, or Firm* — Tung & Associates

(57) ABSTRACT

A chip package unit includes: a base material; at least one chip, disposed on the base material; a package material, enclosing the base material and the chip; and at least one heat dissipation paste curing layer, formed by curing the heat dissipation paste, on a top side of the package material or a back side of the chip in a printed pattern.

9 Claims, 11 Drawing Sheets

CHIP PACKAGE UNIT AND CHIP PACKAGING METHOD

CROSS REFERENCE

The present invention claims priority to TW 110116946 filed on May 11, 2021.

BACKGROUND OF THE INVENTION

Field of Invention

The present invention relates to a chip packaging technology, in particular to a chip package unit including a heat dissipation paste curing layer to increase heat dissipation performance, and a chip packaging method thereof.

Description of Related Art

FIG. 1 shows a chip package unit according to U.S. Pat. No. 6,023,096, wherein the chip package unit includes a substrate 110 with an opening under a chip CH. A package material 100 fills in the space between a metal foil 120, the opening of the substrate 110, and the chip CH. The metal foil 120 provides a function of increasing the heat dissipation performance for the chip CH, but the related manufacturing process is very complicated. First, openings need to be formed in the substrate; next, a package material 100 needs to be provided and the metal foil 120 needs to be disposed on the package material 100 when the package material 100 has not been fully hardened, wherein the metal foil 120 dispositioning process includes etching, positioning, heating, and pressing, which are very complicated, and even more complicated when these process steps need to be integrated.

FIG. 2 shows a chip package unit according to U.S. Pat. No. 6,411,507, in which a metal cover 130 provides the heat dissipation effect, but the metal cover 130 has a complicated shape in order to directly contact the chip CH. Due to the complicated shape of the metal cover 130, the required manufacturing process steps are complicated. Further, it is another technical challenge to correctly assemble the metal cover 130 so that the metal cover 130 can make the best thermal contact with the chip CH. In addition, due to restrictions of the manufacturing process, the metal cover 130 has a minimum size limit such that it is not suitable for small size chip package units. Another U.S. Pat. No. 7,808,087 also has similar issues.

FIG. 3 shows a chip package unit according to U.S. Pat. No. 8,794,889. In order to increase the heat dissipation effect from the chip CH, a heat dissipation multi-fin structure 140 is disposed on the chip CH. This prior art requires the bottom surface of the heat dissipation multi-fin structure 140 to have good thermal contact with the chip CH, because ay gap in between can result in poor heat dissipation. In addition, the heat dissipation multi-fin structure 140 needs to be fastened to the chip CH by screws SC, and a heat dissipation paste needs to be applied, which are steps that an end user is unfamiliar with and often forgets or ignores, so that the actual heat dissipation performance is not as expected. In short, this design is not user-friendly. Besides, the heat dissipation multi-fin structure 140 also has its minimum size limit due to restrictions of the manufacturing process, such that it cannot be applied to small size chip package units.

To overcome the above-mentioned drawbacks, the present invention provides a chip package unit and a chip packaging method thereof, which have the benefits of simple manufacturing process, cost effectiveness, and no size limitation.

SUMMARY OF THE INVENTION

In one perspective, the present invention provides a chip package unit, which includes: a base material; at least one chip, disposed on the base material; a package material, enclosing the base material and the chip; and at least one heat dissipation paste curing layer, formed on a top side of the package material or on a back side of the chip in a printed pattern.

In various embodiments of the present invention, the chip package unit can be used in a lead frame type package, a substrate type package, or a die exposed package. In some embodiments, the base material can include a lead frame, a substrate, or a portion of a wafer.

In one embodiment, there are more than one heat dissipation paste curing layer.

In some embodiments, the printed pattern includes at least one of the following patterns: a closed and fully-filled pattern, a dot matrix pattern, a strip matrix pattern, a combination of two or more of the above patterns, or a stack of two or more of the above patterns.

In one embodiment, the heat dissipation paste curing layer is formed by steps including: placing a stencil on the package material or the back side of the chip, wherein the stencil has hollow grooves corresponding to the printed pattern; stacking the heat dissipation paste on the stencil; scraping a portion of the stacked heat dissipation paste into the hollow grooves of the stencil to coat the portion of the heat dissipation paste on the package material or the back side of the chip; removing the stencil from the package material or the back side of the chip, to leave the portion of the heat dissipation paste corresponding to the hollow grooves on the package material or the back side of the chip; curing the portion of the heat dissipation paste on the package material or the back side of the chip, to form the heat dissipation paste curing layer in the printed pattern.

In one embodiment, the heat dissipation paste is formed on the package material or the chip back side by: pressing and flattening the heat dissipation paste on the package material or the back side of the chip (for example, by a solder coin process).

In another perspective, the present invention provides a chip packaging method, which includes: providing a module including a plurality of chips, wherein the module includes a wafer, a substrate strip, a lead frame or a package material structure; placing a stencil having hollow grooves on the module; stacking a heat dissipation paste on the stencil, and scraping a portion of the stacked heat dissipation paste into the hollow grooves of the stencil, to dispose the portion of the heat dissipation paste on the module; removing the stencil on the module, to leave the portion of the heat dissipation paste corresponding to the hollow grooves on the wafer or the package material structure; curing the portion of the heat dissipation paste to form a heat dissipation paste curing layer corresponding to the hollow grooves; and cutting the module into multiple chip units.

In one embodiment, the chip packaging method further includes: pressing and flattening the heat dissipation paste disposed on the package material or the back side of the chip.

In one embodiment, the plurality of chips are provided on a base material, and after cutting the module into multiple chip units, each of the chip units and a corresponding portion of the base material are packaged by a package material.

The objectives, technical details, features, and effects of the present invention will be better understood with regard to the detailed description of the embodiments below, with reference to the attached drawings.

DESCRIPTION OF THE PREFERRED EMBODIMENTS

The drawings as referred to throughout the description of the present invention are for illustration only, to show the interrelations between the components or units, but not drawn according to actual scale of sizes.

Figure 1:
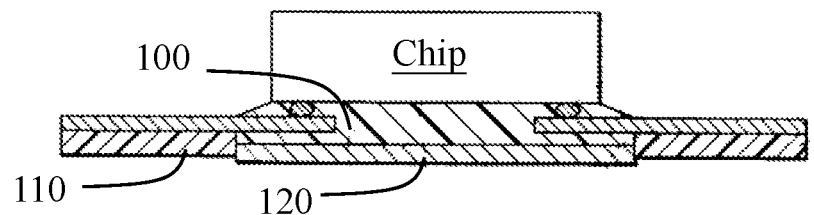
FIGS. 1 to 3 show schematic diagrams of prior art chip package units.
Figure 2:
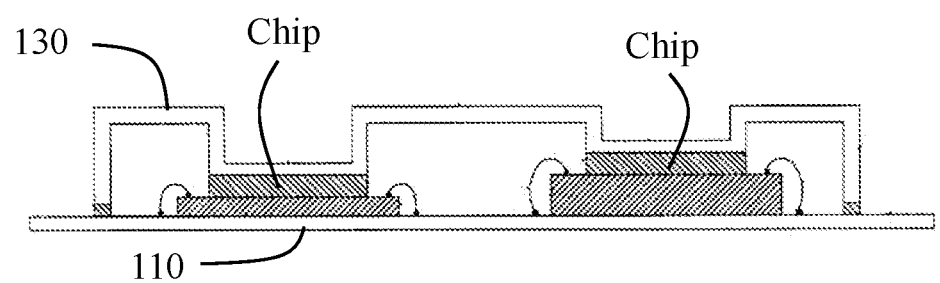
Figure 3:
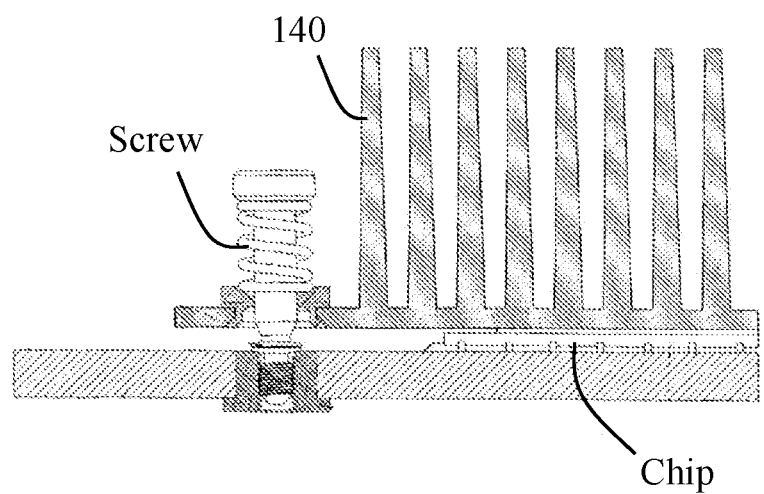
Figure 4:
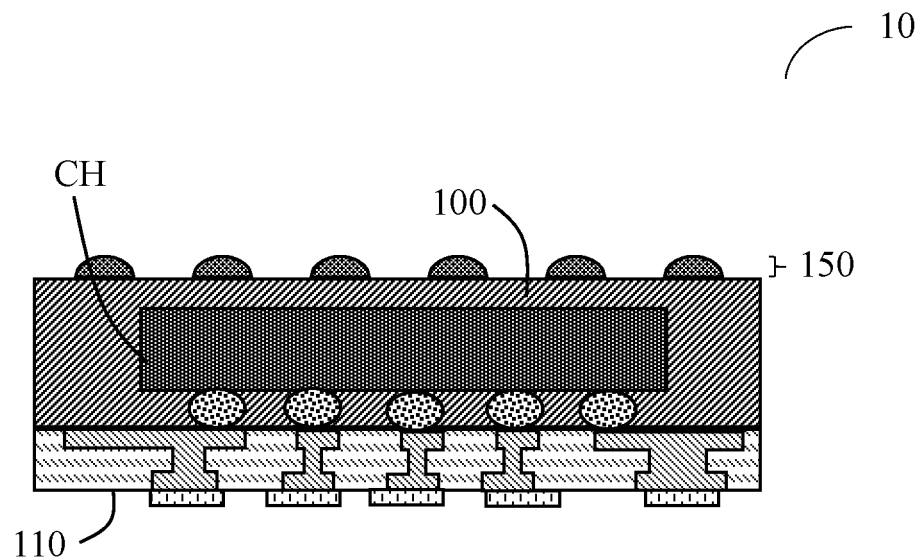
FIGS. 4 and 5 respectively show schematic diagrams of chip package units according to two embodiments of the present invention.
Figure 5:
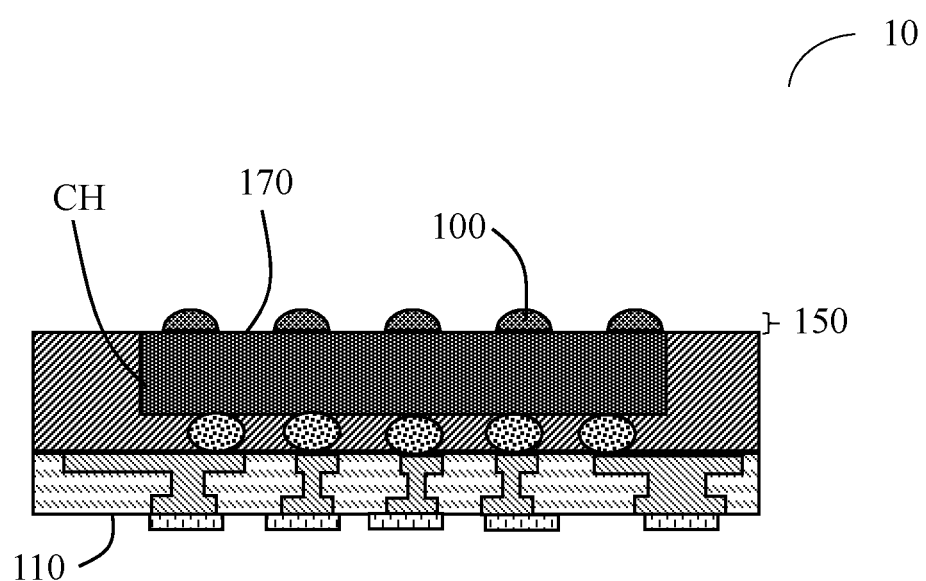
Figure 6A:
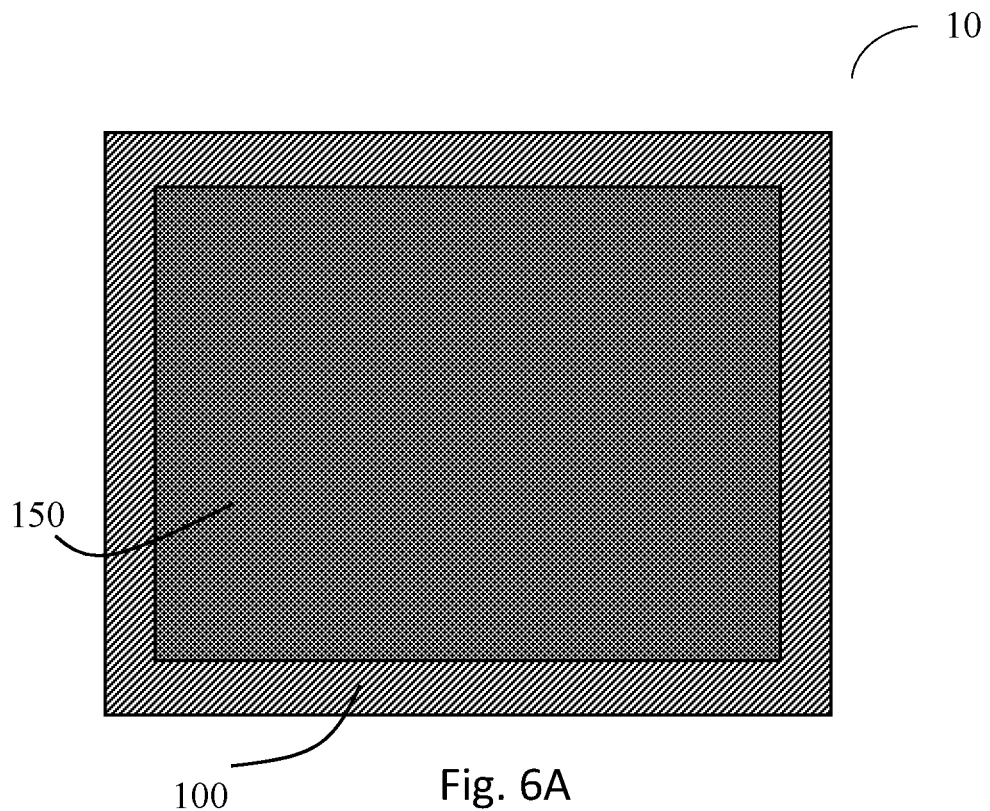
FIGS. 6A-6B, 7A-7B, 8A-8B and 9A-9B respectively show schematic diagrams of heat dissipation paste curing layers according to multiple embodiments of the present invention.
Figure 6B:
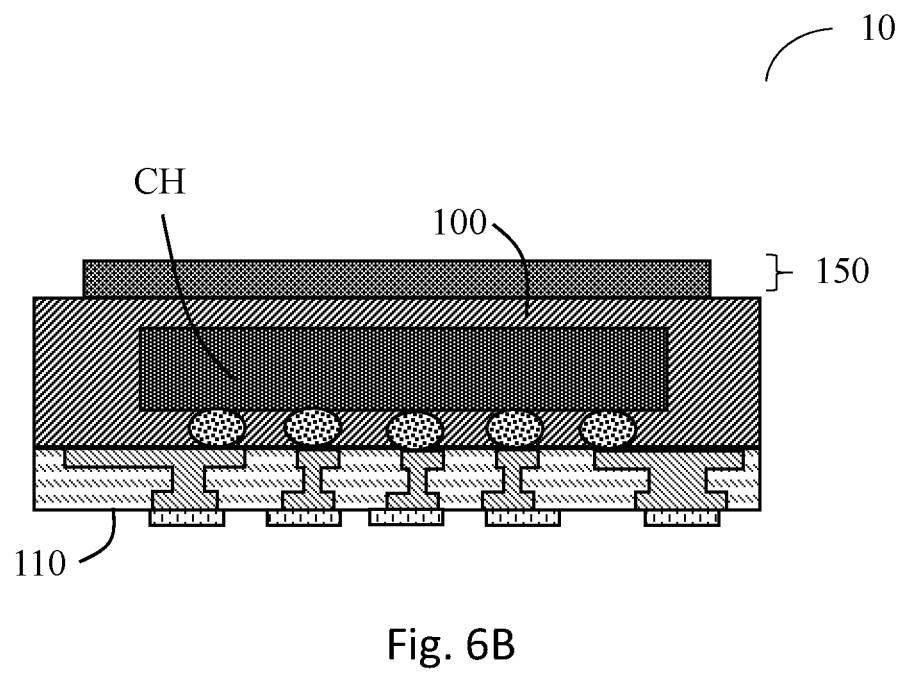
Figure 7A:
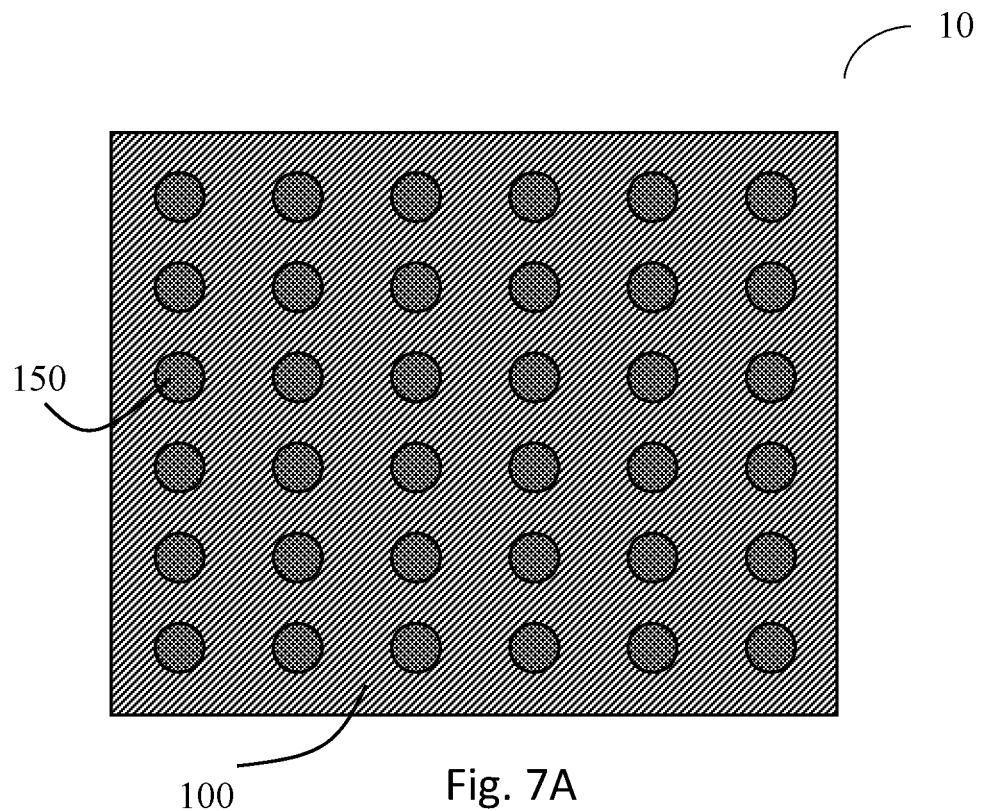
Figure 7B:
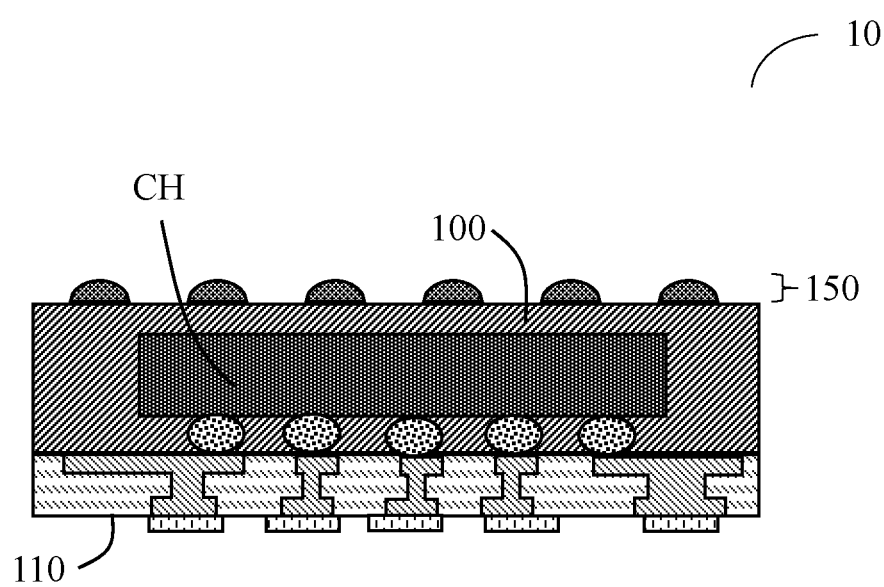
Figure 8A:
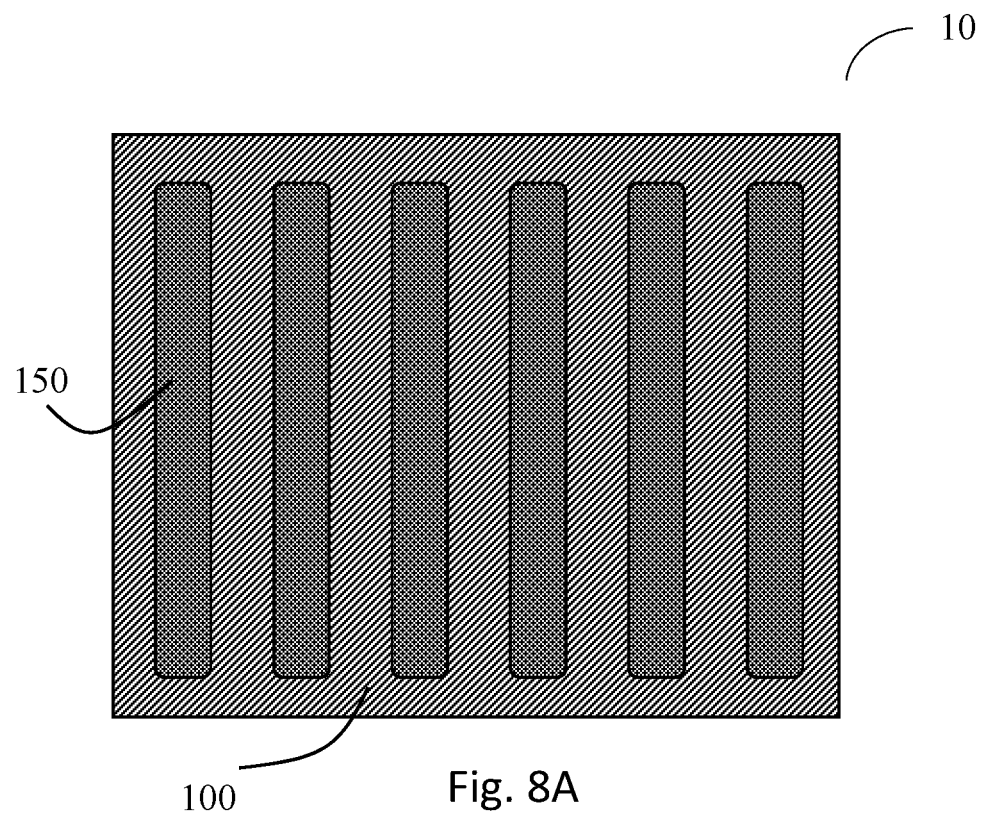
Figure 8B:
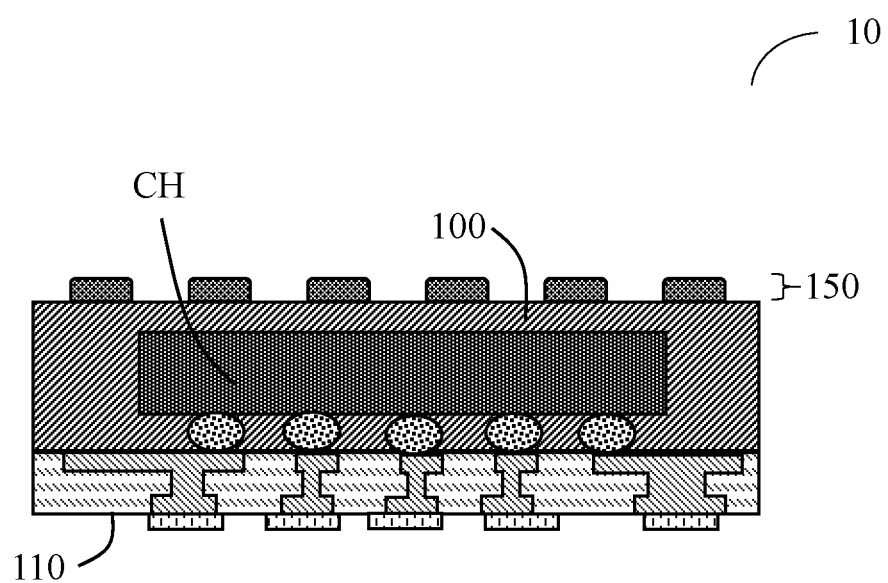

Please refer to FIGS. 4 and 5, which respectively show two different embodiments of the present invention. In one perspective, the present invention provides a chip package unit 10, which includes: a base material 110; at least one chip CH disposed on the base material 110; a package material 100, enclosing the base material 110 and the chip CH; and at least one heat dissipation paste curing layer 150. In one embodiment, the heat dissipation paste curing layer 150 is formed by steps including: providing a heat dissipation paste on a top side of the package material 100 (FIG. 4) or on a back side 170 of the chip CH (FIG. 5), and curing the heat dissipation paste on the top side of the package material 100 or on the back side 170 of the chip CH in a printed pattern, to form the at least one heat dissipation paste curing layer 150.

In one embodiment, the composition of the heat dissipation paste may include metal (such as copper, aluminum, silver, and tin) or other materials with high thermal conductivity. Thus, the thermal conductivity of the heat dissipation paste curing layer 150 will be higher than the package material, which can greatly increase the heat dissipation performance through the top side of the package material 100 or the back side 170 of the chip CH. The heat dissipation paste can be disposed on the top side of the package material or the back side 170 in a liquid or viscous state. In one embodiment, the back side 170 may be the opposite side of the pin side of the chip CH, and the back side 170 may include a silicon-based material.

In one embodiment, a package material structure including multiple chip package units 10 is formed on a wafer, and the chip package units 10 are cut into individual pieces. In some embodiments, the base material 110 includes a lead frame, a substrate, or a portion of the wafer. When the base material includes the lead frame, the lead frame can be a part of a lead frame strip. That is, at the state in wafer form, multiple chips CH are provided on the lead frame strip, and thereafter multiple chip package units 10 are formed by cutting the package material structure into individual pieces, whereby the lead frame strip is cut into multiple lead frames. In this embodiment, the base material 110 is a portion of a wafer-level base material.

In one embodiment, there can be two or more layers of the heat dissipation paste curing layers 150. The two or more heat dissipation paste curing layers can have different printed patterns and stacked one on another to form desired heat dissipation paths, heat dissipation areas, and heat dissipation characteristics, to achieve better heat dissipation performance.

Figure 9A:
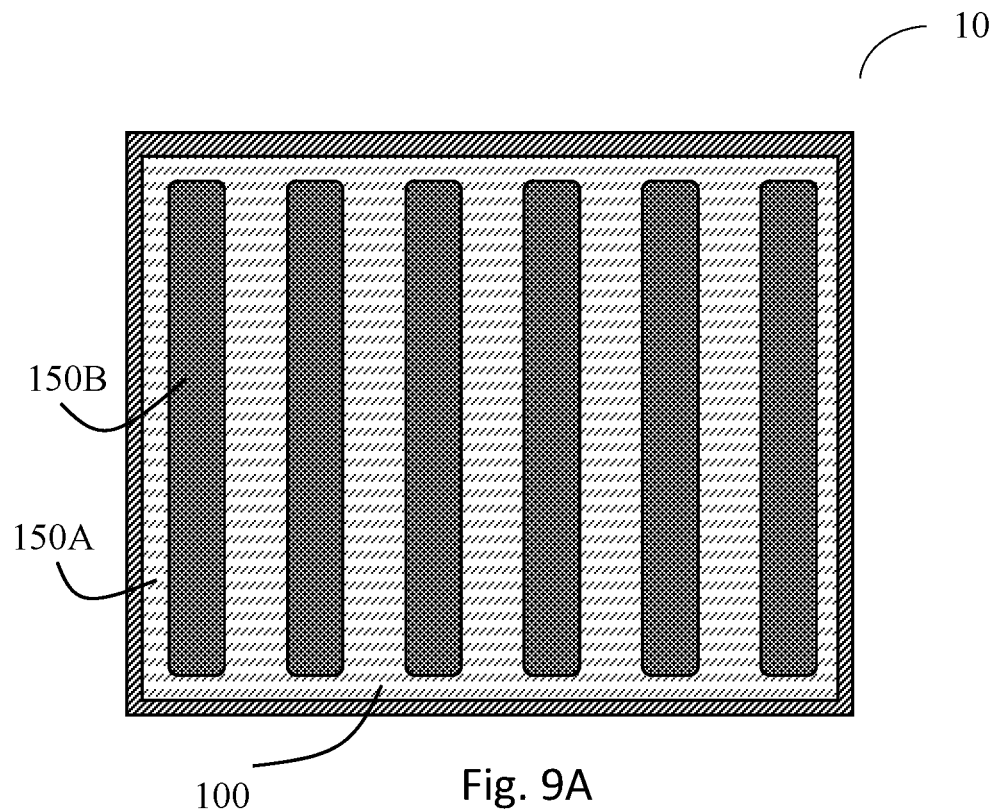
Figure 9B:
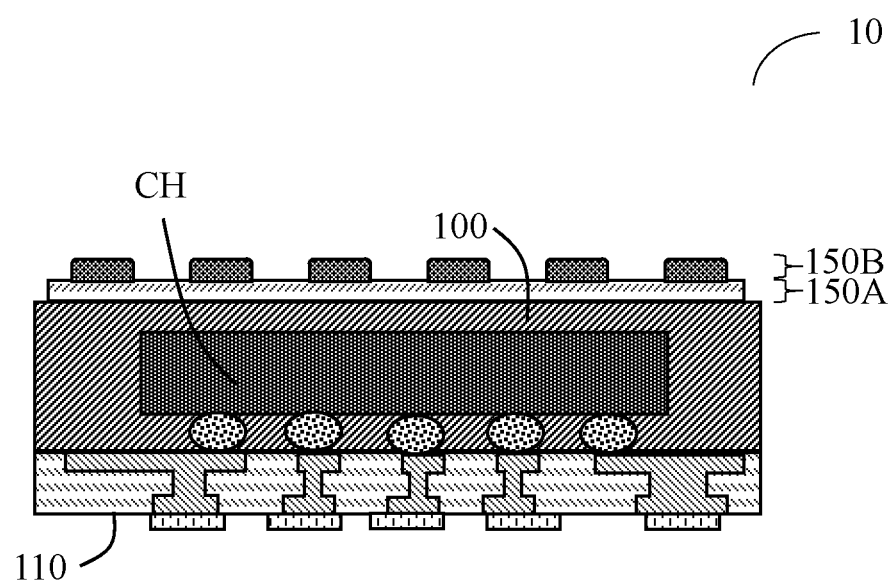

FIGS. 6A-6B, 7A-7B, 8A-8B and 9A-9B show examples of the printed pattern, such as: a fully-filled pattern (FIGS. 6A and 6B), a dot matrix pattern (FIGS. 7A and 7B), strip matrix pattern (FIGS. 8A and 8B), or any combination of the above or other geometric patterns (for example, there can be different types of printed patterns on the same layer, on the top side of the package material 100 or on the back side 170 of the chip CH). In another embodiment, there can be a stack of two or more patterns on two or more layers; for example, FIGS. 9A and 9B show an embodiment wherein there is a stack of two different patterns of layers 150A and 150B. For another example, the stack of patterns may include a small fully-filled area of one heat dissipation paste curing layer, stacked on a large fully-filled area of another heat dissipation paste curing layer. For yet another example, on one layer or on different layers, the pattern or patterns may include a denser distribution of the heat dissipation paste in a main heat dissipation area, and a sparser distribution of the heat dissipation paste in a secondary heat dissipation area. These and other geometry patterns all fall within the scope of the present invention.

Usually there are markings on the chip package unit to indicate, e.g., trademark, model name and further information. According to the present invention, in one embodiment, the printed pattern can leave a blank area for the markings, or in another embodiment, at least a portion of the markings can be formed by using the heat dissipation paste.

Figure 10A:
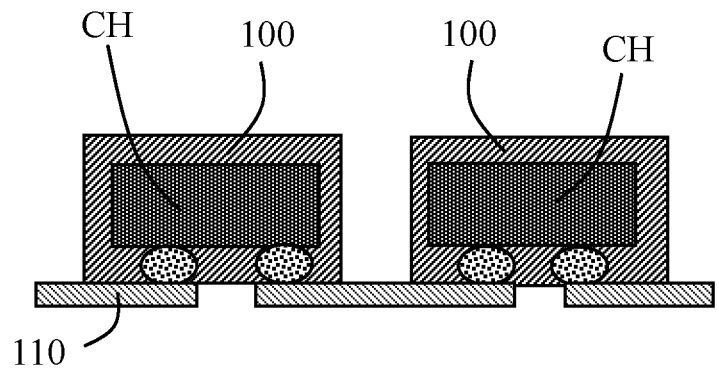
FIGS. 10A to 10H steps of a chip packaging method according to one embodiment of the present invention.
Figure 10B:
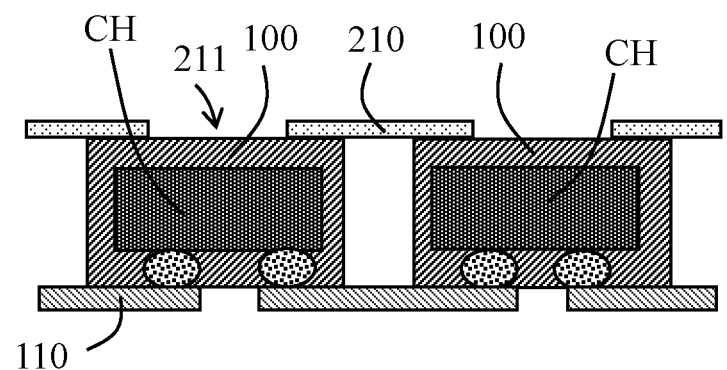
Figure 10C:
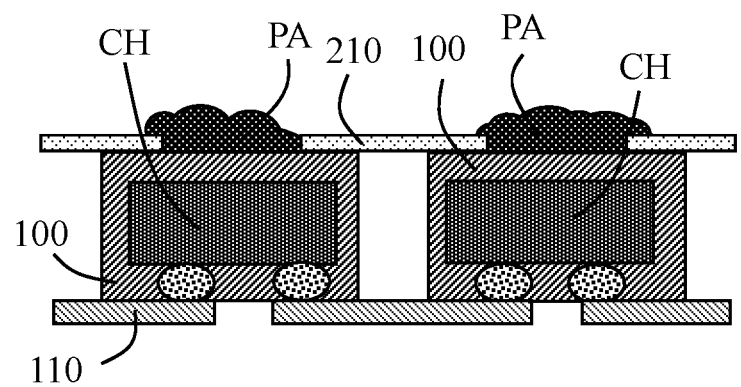
Figure 10D:
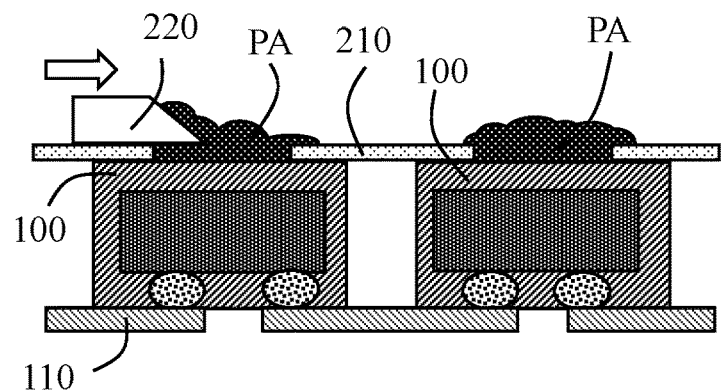
Figure 10E:
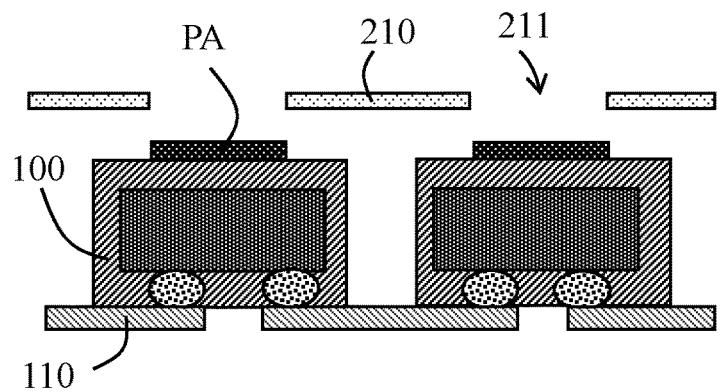
Figure 10F:
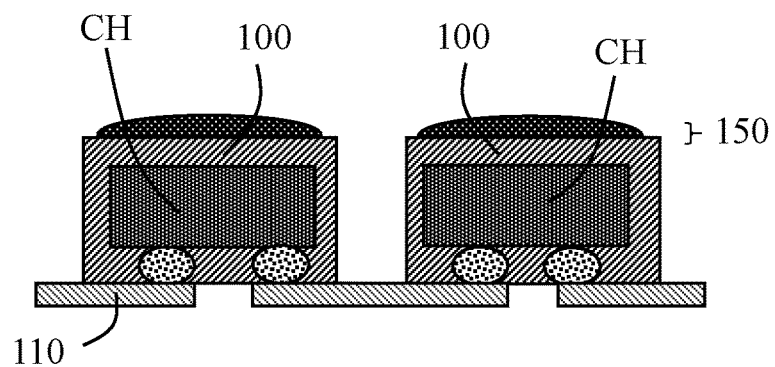

In one embodiment, the steps of forming the heat dissipation paste curing layer 150 include: placing a stencil 210 on the package material 100 (or the back side of the chip CH) (FIGS. 10A and 10B), wherein the stencil 210 has hollow grooves (or through holes) 211 (FIG. 10B), and the hollow grooves correspond to the desired printed pattern; stacking the heat dissipation paste PA on the stencil 210 (FIG. 10C); as shown in FIG. 10D, using a scraper 220 to scrape a portion of the stacked heat dissipation paste PA into the hollow grooves of the stencil 210, wherein the portion of the heat dissipation paste PA on the stencil 210 outside the through hole 211 is blocked so as not to be formed the package material 100 or the back side of the chip CH, such that the portion of the heat dissipation paste PA formed on the package material 100 (or the back side of the chip CH) has the desired printed pattern; removing the stencil 210 from the package material 110 (or the back side of the chip CH), to leave the portion of the heat dissipation paste PA corresponding to the hollow grooves on the package material 110 or the back side of the chip CH (FIG. 10E); curing the heat dissipation paste PA (for example, by reflow welding to melt and solidify the heat dissipation paste PA) on the package material 100 (or the back side of the chip CH) to form the heat dissipation paste curing layer 150 in the printed pattern (FIG. 10F).

In one embodiment, instead of the foregoing method of printing the heat dissipation paste by using the stencil and the scraper, the present invention can also transfer the heat dissipation paste to the package material or the back side of the chip in the printed pattern by pad printing or silk printing. All these methods belong to the scope of the present invention.

In one embodiment, a graphene coating can be disposed on the heat dissipation paste curing layer 150 to increase the heat dissipation performance of the heat dissipation paste curing layer.

Figure 10G:
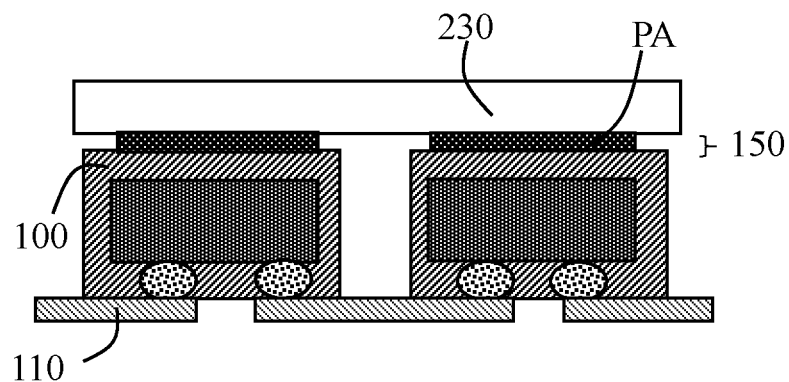

Please refer to FIG. 10G, in one embodiment, the step of melting and solidifying the heat dissipation paste on the package material or the back side of the chip includes: pressing and flattening the heat dissipation paste on the package material or the back side of the chip (for example, by a solder coin process).

Figure 10H:
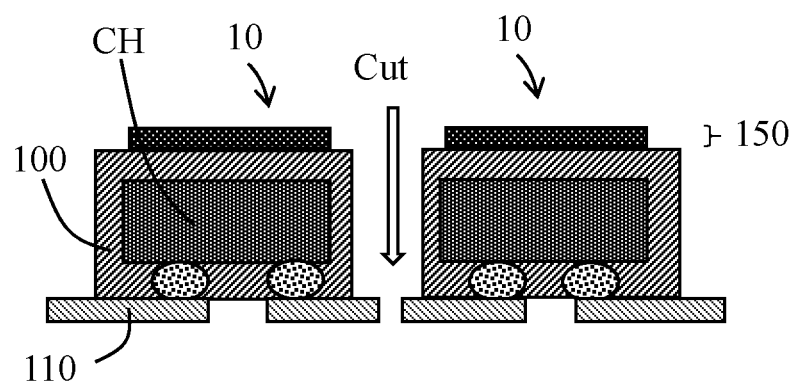

With reference to FIGS. 10A to 10F, in another perspective, the present invention provides a chip packaging method, which includes: providing a wafer including a package material structure, wherein the package material structure encloses a plurality of chips CH therein (FIG. 10A), and wherein the package material structure includes a base material 110, a package material 100, and the chips CH; placing a stencil 210 on the package material structure (FIG. 10B); stacking the heat dissipation paste PA on the stencil 210 (FIG. 10C), using a scraper 220 to scrape a portion of the stacked heat dissipation paste PA into the hollow grooves of the stencil 210, to dispose the portion of the stacked heat dissipation paste PA in direct contact with on the package material structure (FIG. 10D); removing the stencil 210 from the package material structure, leaving the portion of the heat dissipation paste PA corresponding to the hollow grooves on the package material structure (FIG. 10E); curing the heat dissipation paste PA to form a heat dissipation paste curing layer 150 corresponding to the hollow grooves (FIG. 10F); and cutting the package material structure into multiple chip package units 10 (FIG. 10H).

Please refer to FIG. 10G, in one embodiment, the chip packaging method further includes: pressing and flattening the heat dissipation paste PA on the package material 100 or on the back side of the chip CH. In this step, in one embodiment, the heat dissipation paste PA on the package material structure can be pressed by a jig 230, to flatten the heat dissipation paste PA.

Figure 11:
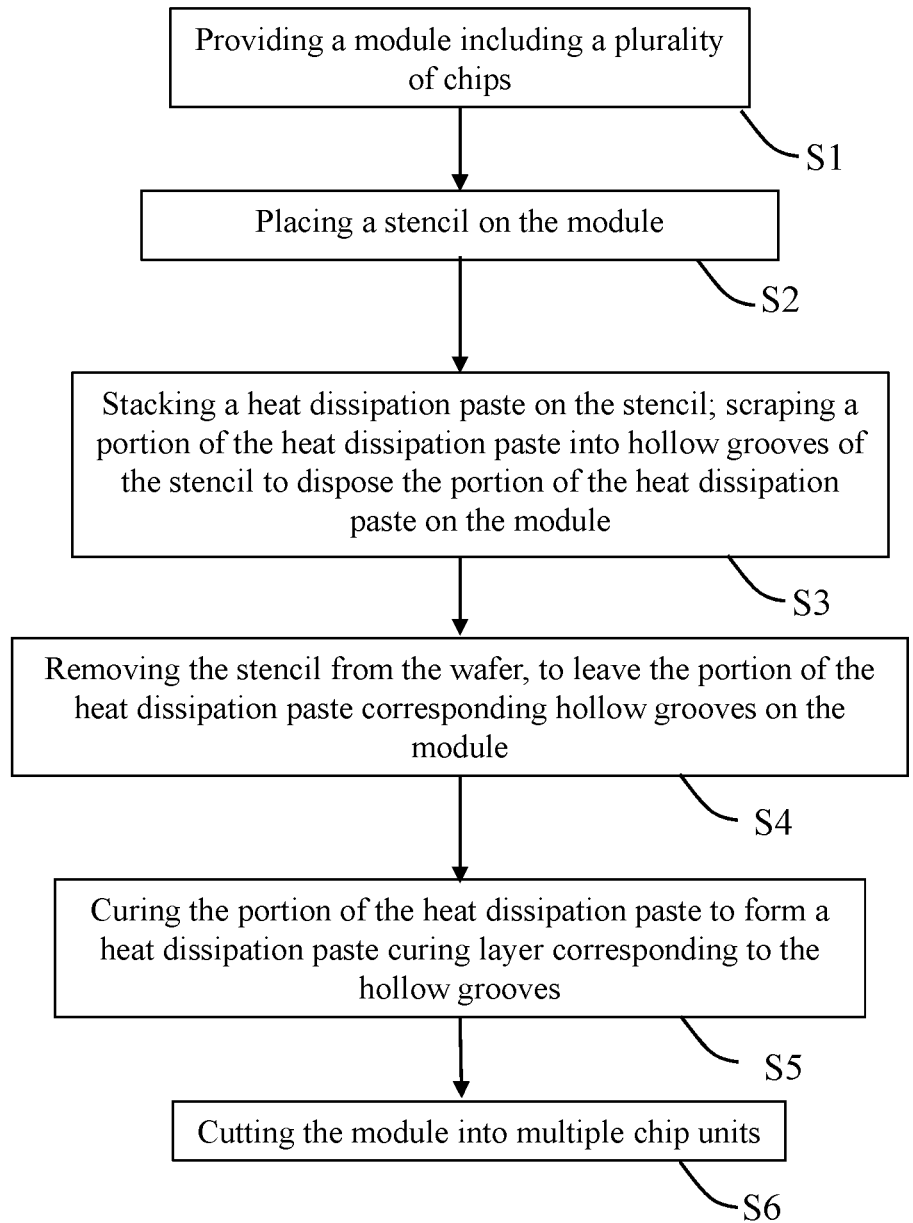
FIG. 11 shows a flow chart of the chip packaging method according to one embodiment of the present invention.

The chip packaging method of the present invention is not limited to the aforementioned application of manufacturing the chip units by forming a package material structure; the present invention is also applicable to an application of manufacturing the chip units by means of a wafer with a plurality of chips. As shown in FIG. 11, in another perspective, the present invention provides a chip packaging method, which includes: providing a module including a plurality of chips (S1), wherein the module includes a wafer, a substrate strip, a lead frame or a package material structure, wherein the chips are provided on a base material; placing a stencil on the module (S2); stacking a heat dissipation paste on the stencil, and scraping a portion of the stacked heat dissipation paste into hollow grooves of the stencil to dispose the portion of the heat dissipation paste on the module (S3); removing the stencil on the wafer, to leave the portion of the heat dissipation paste corresponding hollow grooves on the module (S4); curing the portion of the heat dissipation paste to form a heat dissipation paste curing layer corresponding to the hollow grooves (S5); and cutting the module into multiple chip package units (S6). Regarding the details of the steps in this embodiment, please refer to the description of the foregoing embodiment, and they are not redundantly repeated here.

In one embodiment, the chip packaging method of FIG. 11 further includes: pressing and flattening the heat dissipation paste on the back side of the chip.

In one embodiment, after the step of cutting the wafer into the chip units, a package material is provided to enclose each of the chips and the base material.

Note that, the wafer is for example a semiconductor wafer such as silicon wafer; and the substrate strip is for example a semiconductor strip; wherein each of the wafer and the substrate strip includes devices and circuits, as well known by those skilled in the art, so details thereof are omitted here.

The present invention has been described in considerable detail with reference to certain preferred embodiments thereof. It should be understood that the description is for illustrative purpose, not for limiting the broadest scope of the present invention. An embodiment or a claim of the present invention does not need to achieve all the objectives or advantages of the present invention. The title and abstract are provided for assisting searches but not for limiting the scope of the present invention. Those skilled in this art can readily conceive variations and modifications within the spirit of the present invention. For example, two or more of the embodiments can be used together, or, a part of one embodiment can be used to replace a corresponding part of another embodiment. In view of the foregoing, the spirit of the present invention should cover all such and other modifications and variations, which should be interpreted to fall within the scope of the following claims and their equivalents.

What is claimed is:

1. A chip package unit, including:
   a base material;
   at least one chip, disposed on the base material;
   a package material, enclosing the chip; and
   at least one cured heat dissipation paste layer, formed on a top side of the package material or on a back side of the chip in a printed pattern.

2. The chip package unit according to claim 1, wherein a thermal conductivity of the cured heat dissipation paste layer is higher than a thermal conductivity of the package material.

3. The chip package unit according to claim 1, wherein the base material includes a lead frame, a substrate, or a portion of a wafer.

4. The chip package unit according to claim 1, wherein the at least one cured heat dissipation paste layer includes a plurality of cured heat dissipation paste layers.

5. The chip package unit according to claim 4, wherein the plurality of cured heat dissipation paste layers have different printed patterns.

6. The chip package unit according to claim 5, wherein each cured heat dissipation paste layer has a printed pattern, and the printed pattern includes at least one of the following patterns: a closed and fully-filled pattern, a dot matrix pattern, a strip matrix pattern, or a combination of two or more of the above patterns, or the plurality of cured heat dissipation paste layers form a stack of two or more of the above patterns.

7. The chip package unit according to claim 1, wherein the cured heat dissipation paste layer is formed by steps including: placing a stencil on the package material or the back side of the chip, wherein the stencil has hollow grooves; stacking heat dissipation paste on the stencil;
   scraping a portion of the stacked heat dissipation paste into the hollow grooves of the stencil to coat the portion of the heat dissipation paste on the package material or the back side of the chip; removing the stencil from the package material or the back side of the chip, to leave the portion of the heat dissipation paste corresponding to the hollow grooves on the package material or the back side of the chip; curing the portion of the heat dissipation paste on the package material or the back side of the chip, to form the cured heat dissipation paste layer in the printed pattern.

8. The chip package unit according to claim 7, wherein the cured heat dissipation paste layer in the printed pattern is formed by: pressing and flattening the heat dissipation paste on the package material or the back side of the chip.

9. The chip package unit according to claim 1, further including a graphene coating layer, disposed on the at least one cured heat dissipation paste layer.

* * * * *